United States Patent
Chang et al.

(10) Patent No.: US 12,080,363 B2
(45) Date of Patent: *Sep. 3, 2024

(54) OPERATION METHOD OF MULTI-BITS READ ONLY MEMORY

(71) Applicant: Chen-Feng Chang, Taoyuan (TW)

(72) Inventors: Chen-Feng Chang, Taoyuan (TW); Tien-Sheng Chao, Hsinchu (TW)

(73) Assignee: Chen-Feng Chang, Taoyuan (TW)

( * ) Notice: Subject to any disclaimer, the term of this patent is extended or adjusted under 35 U.S.C. 154(b) by 199 days.

This patent is subject to a terminal disclaimer.

(21) Appl. No.: 17/722,534

(22) Filed: Apr. 18, 2022

(65) Prior Publication Data

US 2022/0343986 A1 Oct. 27, 2022

Related U.S. Application Data

(60) Provisional application No. 63/201,306, filed on Apr. 23, 2021.

(51) Int. Cl.
| | | |
|---|---|---|
| *G11C 16/04* | (2006.01) | |
| *G11C 11/56* | (2006.01) | |
| *G11C 17/12* | (2006.01) | |
| *H10B 20/20* | (2023.01) | |
| *H10B 43/00* | (2023.01) | |

(Continued)

(52) U.S. Cl.
CPC .......... *G11C 17/12* (2013.01); *G11C 11/5671* (2013.01); *G11C 16/0466* (2013.01); *H10B 20/20* (2023.02); *H10B 43/00* (2023.02); *H01L 29/0673* (2013.01); *H01L 29/42392* (2013.01)

(58) Field of Classification Search
CPC .. G11C 17/12; G11C 11/5671; G11C 16/0466
See application file for complete search history.

(56) References Cited

U.S. PATENT DOCUMENTS

| | | | |
|---|---|---|---|
| 6,870,233 B2 * | 3/2005 | Chen | H10B 20/00 365/182 |
| 6,992,909 B2 | 1/2006 | Chen et al. | |

(Continued)

FOREIGN PATENT DOCUMENTS

| | | |
|---|---|---|
| TW | 312042 B | 8/1997 |
| TW | 507366 B | 10/2002 |
| TW | I253717 B | 4/2006 |

*Primary Examiner* — Pho M Luu
(74) *Attorney, Agent, or Firm* — Best & Flanagan LLP (57) ABSTRACT

An operation method of a multi-bits read only memory includes a step of applying a gate voltage to a conductive gate, a first voltage to a first electrode, and a second voltage to a second electrode. The multi-bits read only memory includes a substrate and a transistor structure with the conductive gate mounted between the first electrode and the second electrode. A multiplicity of M nanowire channels is mounted between the first electrode and the second electrode, and M is a positive integer greater than one. The operation method breaks multiple states of the multi-bits read only memory. The multiple states are programmable and include an $i^{th}$ state, and $1 \le i \le M$. The aforementioned states allow storage of multiple bits on the read only memory, instead of just storing a single bit on the read only memory.

12 Claims, 6 Drawing Sheets

(51) Int. Cl.
    *H01L 29/06*         (2006.01)
    *H01L 29/423*       (2006.01)

(56) References Cited

U.S. PATENT DOCUMENTS

| | | | |
|---|---|---|---|
| 7,012,310 B2 * | 3/2006 | Lee | G11C 17/12 |
| | | | 257/E27.102 |
| 11,837,299 B2 * | 12/2023 | Chang | G11C 11/5642 |

\* cited by examiner

OPERATION METHOD OF MULTI-BITS READ ONLY MEMORY

CROSS-REFERENCE TO RELATED APPLICATION(S)

This application claims the priority benefit of provisional application Ser. No. 63/201,306 filed on Apr. 23, 2021, the entirety of which is hereby incorporated by reference herein and made a part of the specification.

BACKGROUND OF THE INVENTION

1. Field of the Invention

The present invention relates to an operation method of a read only memory, more particularly an operation method of a multi-bits read only memory. The multi-bits of the read only memory are programmable, allowing the present invention to provide better operation means for a wide variety of industrial applications, such as increasing information confidentiality of precision components.

2. Description of the Related Art

As computers, communication products, and consumer electronics increase in popularity, electronics manufacturers become more aware and focus on protecting their independently developed products. For instance, in recent years, manufacturers often implement a One Time Programmable Read Only Memory (OTPROM) in a processor chip to protect data stored inside the chip from being altered. Further, both companies and academic institutes have put forth effort into researching designs for OTPROM. Currently, OTPROM is also widely used in sensor chips of smart phones for correcting and/or adjusting storing parameters of analog circuit signals. OTPROM is also used in smart phones to indicate a software version of an operating system.

The programming of OTPROM is well known to be an irreversible one-time data writing process. Generally, in an initial state, all the bits stored within OTPROM should have the same value. For example, each bit stored within each of the memory cells within each saving block of an OTPROM should be "0" in an initial state. Once a control chip writes data, or burns data, into the OTPROM, one bit or more than one bit stored within a designated memory cell of OTPROM will change from "0" to "1".

In comparison to rewritable memories, OTPROM has lower manufacturing cost and more stable information storing abilities. Each bit of the memory cell of OTPROM may be programmed by altering a state of a fuse corresponding to each of the bits. Once altered, OTPROM remains unchanged forever in electronics, hence the data-written OTPROM is perfect for storing default programs for electronics. For example, in an initial state of a typical OTPROM, all bits initially have value as "1". When data is burnt to the OTPROM, the fuse corresponding to some of the bits may break down from heat of the burn, leading to corresponding values to change from "1" to "0". Since this process is physically altering the OTPROM, the process is irreversible, and the information encoded remains even without electricity. For this reason, the said memory is called OTPROM. Each of the bits of OTPROM has value either as "0" or "1".

Currently, OTPROM is programmed by ways of either fusing or anti-fusing. Fusing refers to how data is burnt to OTPROM by burning and breaking down fuses corresponding to bits. Anti-fusing refers to how data is burnt to OTPROM by burning and melting fuses together to form electrical pathways or channels corresponding to bits. However, in both cases of fusing and anti-fusing, each of the bits being burnt can only be represented in a single bit as "0" or "1". This "single bit" constriction limits how logics may be programmed in all electronics applications, and is also incapable of protecting confidentiality of data information stored in the bits.

Due to the aforementioned problems, how data is programmed and stored in OTPROM should be improved. With years of experience in related fields, the inventor of the present invention felt the need to improve upon the said problems. With great academic research endeavors, the present invention provides a novel and effective design to improve upon the said problems.

SUMMARY OF THE INVENTION

The present invention enables a read only memory to demonstrate multi-bits functionality, and as a result, improving upon the said problem of having only single bit value of "0" or "1" on a single electronic component. The present invention is able to demonstrate multi-bits programmability on a Gate-All-Around FET (GAAFET), and thus demonstrates how the present invention improves data protection of electronics.

Furthermore, due to how the multi-bits read only memory is manufactured, the present invention allows the multi-bits read only memory to be minimized. For example, the multi-bits read only memory of the present invention has dimension less than 5 nanometers (nm). This allows the multi-bits read only memory of the present invention to be used on advanced and confidential products for an improvement of information protection.

On the other hand, the present invention also provides a novel way of operating read only memory. This novel way of operating read only memory transcends advanced electronics to even consumer electronics, and therefore the present invention is also applicable to be used in read only memories of general electronics.

Furthermore, the present invention provides how read only memory can be operated to provide multi-bits functionality to structures such as GAAFET and Silicon-Oxide-Nitride-Oxide-Silicon (SONOS) storing device. Apart from SONOS storing device, the present invention may also apply to memory components with nitride as a trapping layer for a transistor.

With regard to the said goals of the present invention, the present invention is able to provide multi-bits programmability on these transistor structures, and hence further providing practical aspects and improving upon patents and theses of the prior arts.

The present invention provides an operation method of a multi-bits read only memory. The multi-bits read only memory includes a substrate and a transistor structure mounted on the substrate. The transistor structure includes a conductive gate and two ion-doped areas respectively located on two opposite sides of the conductive gate. The two ion-doped areas function as a first electrode and a second electrode located on opposite sides of the conductive gate in the transistor structure. A multiplicity of M nanowire channels are electrically connecting between the first electrode and the second electrode, wherein M is a positive integer greater than one.

The operation method of the multi-bits read only memory includes a step of providing a gate voltage to the conductive gate, a first voltage to the first electrode, and a second voltage to the second electrode while satisfying the following conditions:

condition (A): setting a fully opened state for the multi-bits read only memory by providing the gate voltage to the conductive gate, the first voltage to the first electrode, and the second voltage to the second electrode for conducting all nanowire channels; and condition (B): setting an $i^{th}$ state for the multi-bits read only memory by breaking i nanowire channels; wherein $1 \leq i \leq M$;

wherein the fully opened state, the first state to the $M^{th}$ state are representable as multiple programmable multi-bits.

In an embodiment of the present invention, the multi-bits read only memory has (M+1) states. Each of the states consists of M bits, and each of the M bits corresponds to one of the M nanowire channels respectively. This way bit information of "0" or "1" can be programmed to represent a conduction status of the nanowire channels, in other words, to represent whether each of the nanowire channels is connected as a closed circuit or broken as an open circuit.

In the embodiment when M=2, the fully opened state is represented as (1, 1) as the programmable multi-bits. When all of the M nanowire channels are broken, the multi-bits read only memory is set to be in the $M^{th}$ state, and the $M^{th}$ state is a second state. The second state is represented as (0, 0) as the programmable multi-bits. When one of the M nanowire channels is broken, the multi-bits read only memory is set to be in the first state, and the first state is either represented as (0, 1) or (1, 0) as programmable multi-bits.

Furthermore, while satisfying condition (B), a controller is used to control whether each of the M nanowire channels is broken. With the controller, the present invention would be able to control the multi-bits read only memory to formulate $2^M$ types of programmed multi-bit variations. Though in the current embodiment, the controller is able to formulate $2^M$ types of programmed multi-bit variations, the present invention is free to be elsewise in other embodiments. In other embodiments, an integrated circuit (IC) chip, a microcontroller unit (MCU), or other digital circuits may also be used to control how the M nanowire channels would be broken.

The $2^M$ types of programmed multi-bit variations come from the fact that each of the M nanowire channels may be represented as "0" or "1" to represent a conduction status of each of the M nanowire channels. Therefore, a mathematical combination of $2^M$ variations is formulated across the M nanowire channels.

In an embodiment of the present invention, an insulating oxide layer is mounted between the substrate and the transistor structure. The first electrode and the second electrode are respectively a drain and a source of a transistor.

Furthermore, while satisfying condition (B), a voltage, a current, a power, or an energy may be applied to the transistor structure for fusing the M nanowire channels. In other words, the voltage, the current, the power, or the energy is provided to break the M nanowire channels through heat, and accordingly formulate the first state to the $M^{th}$ state to be programmed.

Any technical personnel in fields relating to the present invention is free to make equivalent changes of the present invention after reading information disclosed by the present invention. However, any equivalent changes made relating to the present invention will be protected by what is claimed for the present invention. The embodiments disclosed by the present invention serve as examples rather than limitations for the present invention.

In conclusion, the present invention provides an operation method to control nanowire channels between the drain and the source of the transistor structure. More particularly, the operation method of the present invention controls how the nanowire channels break so as to encode multi-bits information. This way the present invention is able to better protect the confidentiality of information stored. The operation method of the present invention may break nanowire channels by providing the transistor structure a voltage, a current, a power, or an energy, however the present invention may also use other means to break nanowire channels.

DETAILED DESCRIPTION OF THE INVENTION

Figure 1:
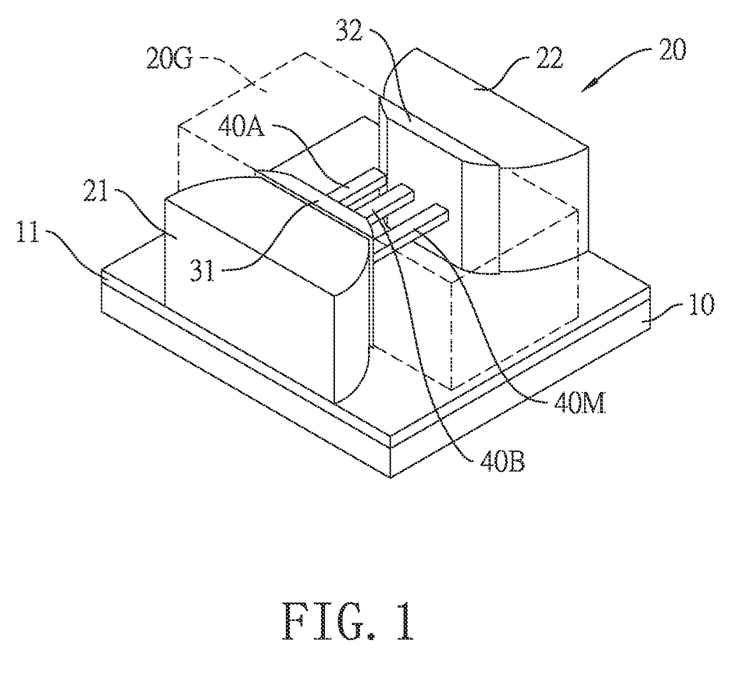
FIG. 1 is a perspective view of a multi-bits read only memory in an embodiment of the present invention.

With reference to FIG. 1, the present invention provides an operation method of a multi-bits read only memory. The present invention uses fusing to program a One Time Programmable Read Only Memory (OTPROM). Fusing primarily uses heat generated by voltage, current, power, or energy to melt fuses of the OTPROM. When a fuse of the OTPROM melts, a bit is being programmed as either conducting circuit or breaking circuit. In an embodiment of the present invention, a multi-bits read only memory of the present invention includes a substrate 10. A transistor structure 20 is mounted on the substrate 10, and more particularly, an insulating oxide layer 11 is additionally mounted between the substrate 10 and the transistor structure 20.

In this embodiment, the transistor structure 20 is a Gate-All-Around FET (GAAFET). The transistor structure 20 includes a conductive gate 20G and two ion-doped areas respectively located on two opposite sides of the conductive gate 20G. The two ion-doped areas function as a first electrode 21 and a second electrode 22 located on opposite sides of the conductive gate 20G in the transistor structure 20. A first gate oxide 31 is formed between the first electrode 21 and the conductive gate 20G, and a second gate oxide 32 is formed between the second electrode 22 and the conductive gate 20G. Furthermore, a multiplicity of M nanowire channels 40A, 40B, . . . 40M are mounted between the first electrode 21 and the second electrode 22 to electrically connect the first electrode 21 and the second electrode 22. The number M is a positive integer greater than one. In other words, at least two nanowire channels 40A, 40B are electrically connecting the first electrode 21 and the second electrode 22. The nanowire channels 40A, 40B, . . . 40M are made of polycrystalline silicon.

Figure 2:
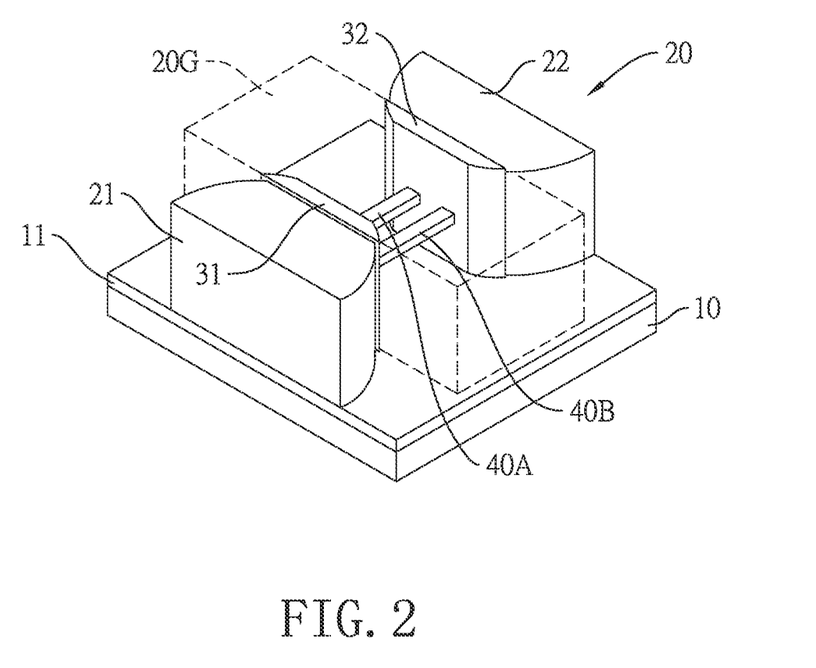
FIG. 2 is a perspective view of the multi-bits read only memory with two nanowire channels in the embodiment of the present invention.

With reference to FIG. 2, in this embodiment M=2, that means the transistor structure 20 has two nanowire channels 40A, 40B to store more than one bit of information between the first electrode 21 and the second electrode 22.

Figure 3:
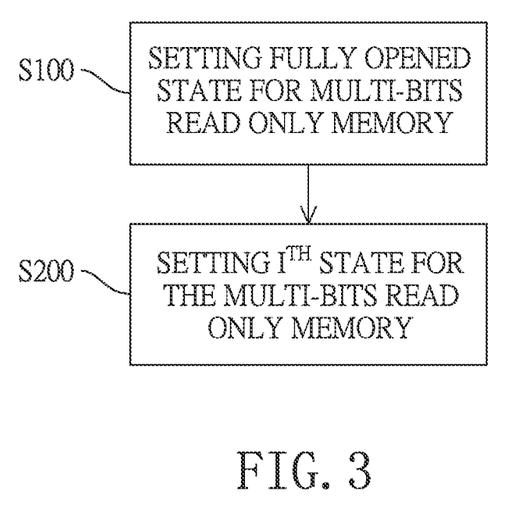
FIG. 3 is a flow chart of an operation method of the multi-bits read only memory in the embodiment of the present invention.

With further reference to FIG. 3, a flow chart discloses steps of the operation method of the multi-bits read only memory in the present embodiment. The operation method of the multi-bits read only memory includes a step of applying a gate voltage to the conductive gate 20G, a first voltage to the first electrode 21, and a second voltage to the second electrode 22 while satisfying conditions (A) and (B). More particularly, the present invention includes the following sub-steps to satisfy conditions (A) and (B):

step S100: satisfying condition (A) by setting a fully opened state for the multi-bits read only memory by providing the gate voltage to the conductive gate, the first voltage to the first electrode, and the second voltage to the second electrode for conducting all of the M nanowire channels 40A, 40B, . . . 40M; and step S200: satisfying condition (B) by setting an $i^{th}$ state for the multi-bits read only memory by breaking i nanowire channels; wherein 1≤i≤M;

wherein the fully opened state, the first state to the $M^{th}$ state are representable as multiple programmable multi-bits.

In the present embodiment, the operation method of the present invention controls the nanowire channels and breaks some of the nanowire channels to program multi-bits in the transistor structure 20. In other words, the present embodiment uses fusing operation to program information into the multi-bits read only memory.

Furthermore, while satisfying condition (B), the present invention includes a step of providing a voltage, a current, a power, or an energy to the transistor structure 20. The voltage, the current, the power, or the energy is provided to the transistor structure 20 to break some of the M nanowire channels. In other embodiments, elsewise may be provided to break the nanowire channels. The voltage, the current, the power, or the energy provided would generate heat and melt away on some of the nanowire channels, and accordingly formulate the first state to the $M^{th}$ state.

Regarding electricity applied to the transistor structure 20, the electricity always flows from higher voltage areas to lower voltage areas, and electric current always chooses pathways with the lowest resistance to flow. With this in mind, the present embodiment applies asymmetric voltage to the transistor structure 20 in order to direct how electric current flow and create heat to melt down some of the nanowire channels. Of course, if desired, the present invention may also break all of the M nanowire channels.

When the present invention melts away the nanowire channels with heat, the heat comes from power that follows the formula:

power=(current)$^2$*resistance wherein when large current passes through one of the nanowire channels, exponentially larger power also passes through the respective nanowire channel and generate heat for melting down the respective nanowire channel, in other words, breaking the respective nanowire channel in the transistor structure 20 by fusing operation.

Regarding the steps disclosed in FIG. 3, the operation method of the present invention is applied to the transistor structure 20, and the transistor structure 20 receives the gate voltage (or $V_G$), the first voltage (or $V_{21}$), and the second voltage (or $V_{22}$).

In step S100, when the conductive gate 20G receives $V_G$, the first electrode 21 receives $V_{21}$, and the second electrode 22 receives $V_{22}$, all of the M nanowire channels of the transistor structure 20 are fully opened for conducting electricity, hence the fully opened state.

Figure 4:
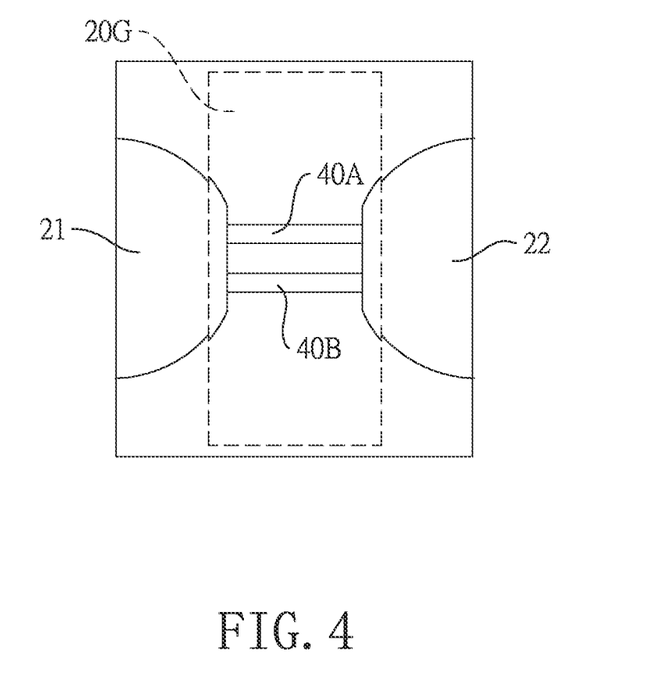
FIG. 4 is a perspective view of the multi-bits read only memory in a fully opened state in the embodiment of the present invention.

With reference to FIG. 4, in the present embodiment, the two nanowire channels 40A, 40B are intact and conducting electricity. The fully opened state depicted here is represented as (1, 1) as programmable multi-bits.

Furthermore, with regard to step S200, the multi-bits read only memory has a total of (M+1) states. The states include the fully opened state, the first state, the second state, and all the way through the $M^{th}$ state. All of these (M+1) states correspond to the programmable multi-bits. Each of the states consists of M bits, and each of the M bits corresponds to one of the M nanowire channels respectively. This way bit information of "0" or "1" can be programmed to represent a conduction status of the nanowire channels, in other words, to represent whether each of the nanowire channels is connected as a closed circuit or broken as an open circuit.

For example, if a Silicon-Oxide-Nitride-Oxide-Silicon (SONOS) storing device has 10 nanowire channels, then when the present invention is applied to the SONOS storing device, the SONOS storing device would be able to have 11 states. The 11 states include a first state corresponding to a first nanowire channel of the SONOS storing device being broken, a second state corresponding to a second nanowire channel of the SONOS storing device being broken, a third state corresponding to a third nanowire channel of the SONOS storing device being broken, and so forth until a tenth state corresponding to a tenth nanowire channel of the SONOS storing device being broken, and additionally a fully opened state wherein all of the 10 nanowire channels are intact without any broken channels.

Further, in this example, each of the 11 states consists of 10 bits, and each of the 10 bits corresponds to a respective one of the 10 nanowire channels. For instance, the SONOS storing device in the fully opened state has the programmable multi-bits represented as (1, 1, 1, 1, 1, 1, 1, 1, 1, 1). When half of the 10 nanowire channels are melted and broken, leaving only 5 of the 10 nanowire channels connected, the SONOS storing device has the programmable multi-bits represented as (1, 1, 1, 1, 1, 0, 0, 0, 0, 0), and so forth. When all of the 10 nanowire channels are melted and broken, the SONOS storing device has the programmable multi-bits represented as (0, 0, 0, 0, 0, 0, 0, 0, 0, 0).

Figure 5:
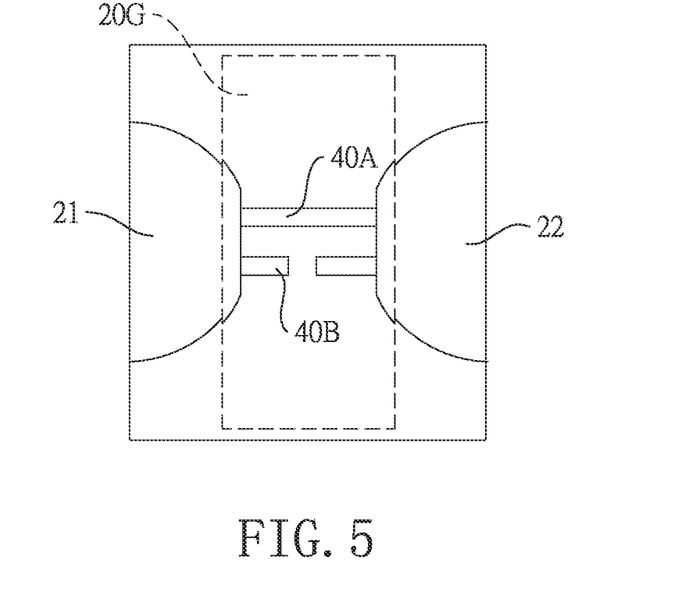
FIG. 5 is a perspective view of the multi-bits read only memory in a first state in the embodiment of the present invention.
Figure 6:
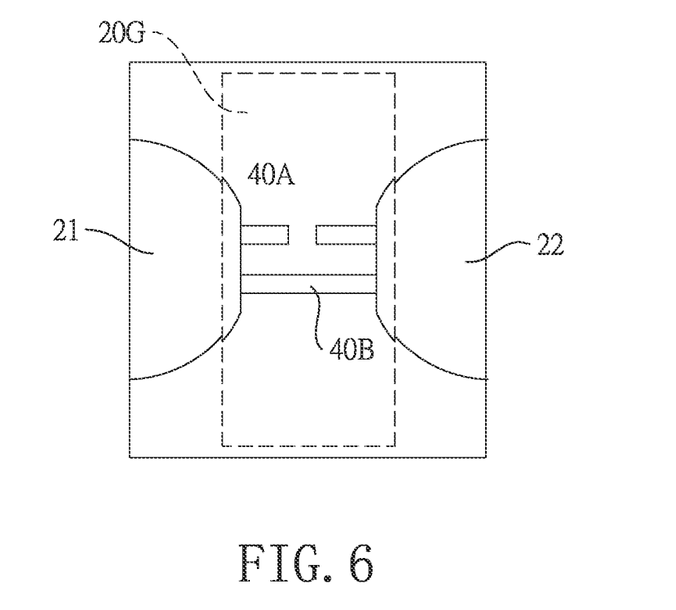
FIG. 6 is a perspective view of the multi-bits read only memory in the first state in another embodiment of the present invention.

With reference to FIGS. 5 and 6, in two different embodiments, two nanowire channels are mounted between the first electrode 21 and the second electrode 22. When one of the two nanowire channels 40A, 40B is melted and broken, as depicted in either an embodiment of FIG. 5 and another embodiment of FIG. 6, the transistor structure 20 is set to be in the first state. In other words, the multi-bits read only memory is set to be in the first state, and the first state is represented as (1, 0) or (0, 1) as the programmable multi-bits.

Figure 7:
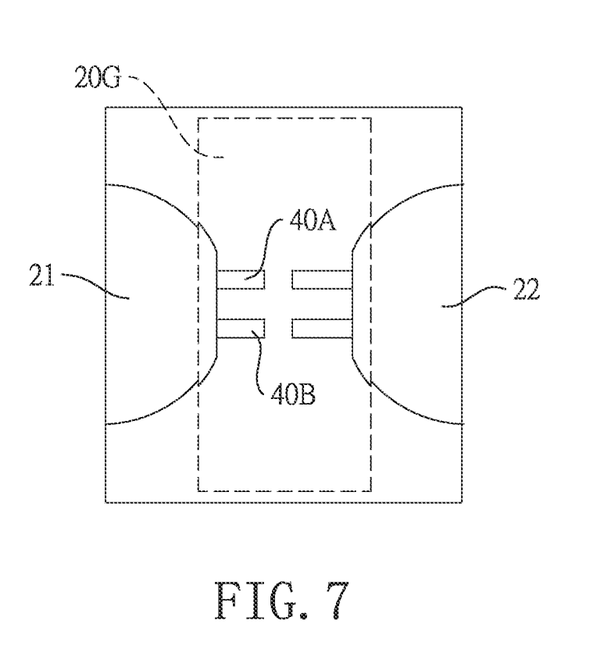
FIG. 7 is a perspective view of the multi-bits read only memory in a second state in the embodiment of the present invention.

Furthermore, while satisfying condition (B), the present invention includes a step of controlling each of the M nanowire channels with a controller, a controller chip, or a microcontroller unit (MCU). The controller is used to control whether each of the M nanowire channels is breaking. The controller may also be the controller chip, the microcontroller unit (MCU), or a micro processing chip with similar functions. When the controller is used to break the nanowire channel 40B as depicted in FIG. 5, the first status is represented as (1, 0) as the programmable multi-bits. When the controller is used to break the nanowire channel 40A as depicted in FIG. 6, the first status is represented as (0, 1) as the programmable multi-bits. With the controller, the present invention would be able to control the multi-bits read only memory, allowing the multi-bits read only memory to formulate $2^M$ types of programmed multi-bit variations With reference to FIG. 7, when all of the nanowire channels are broken, the transistor structure 20 is set to be in the $M^{th}$ state. In other words, when all of the two nanowire channels are broken, the multi-bits read only memory is in the second state, and the second state is represented as (0, 0) as the programmable multi-bits.

Figure 8:
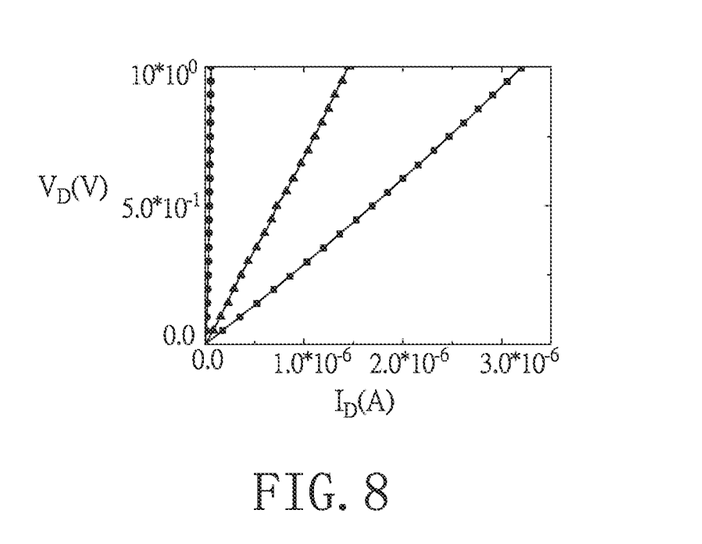
FIG. 8 is a perspective view of electrical current data under each of the states for the multi-bits read only memory with 3.5 volts of gate voltage in the embodiment of the present invention.

With reference to FIG. 8, FIG. 8 provides a perspective view of electrical current data under each of the states for the multi-bits read only memory with $V_G$=3.5 volts (V). A horizontal axis represents a drain current in ampere, represented as $I_D(A)$, and a vertical axis represents a drain voltage in volts, represented as $V_D(V)$. Squares in FIG. 8 represent experimental data samples in the fully opened state, triangles in FIG. 8 represent experimental data samples in the first state with one of the two nanowire channels broken, and circles in FIG. 8 represent experimental data samples in the second state with both of the two nanowire channels broken.

Using analogy from an equivalent circuit, if a single strip of nanowire channel has equivalent resistance R, then when the two nanowire channels are both conducting in parallel, the resistance between the first electrode 21 and the second electrode 22 becomes R/2. In other words, the resistance between a source and a drain of a transistor, or the transistor structure 20, is R/2.

When one of the nanowire channels is broken, in the first state the resistance across the source and the drain becomes R. Since the resistance across the source and the drain increases from R/2 to R, $I_D$ logically decreases.

When both of the nanowire channels are broken, in the second state the resistance across the source and the drain resembles a state of insulation. In other words, the resistance across the source and the drain greatly increases since all conducting pathways are severed, and so logically electrical current also stops flowing across the source and the drain of the transistor structure 20.

According to FIG. 8, when both of the nanowire channels are conducting, the effective resistance between the source and the drain is $3.1*10^5$ Ohms (Ω). When one of the nanowire channels is broken, in the first state the resistance across the source and the drain is $6.9*10^5$ Ω. When both of the nanowire channels are broken, in the second state the resistance across the source and the drain is $1.9*10^7$ Ω. In other words, evidently in the second state the resistance increased roughly about 100 folds from the first state and the fully opened state. This effectively means the resistance is too great for maintaining conduction across the source and the drain of the transistor structure 20.

The experimental result depicted in FIG. 8 is disclosed as a reference for personnel in memory related fields to easily understand a current state of the memory component at hand. By understanding the current state and condition of the memory component, personnel should be able to easily formulate a next step for operating the memory component.

The present invention provides a novel way of operating read only memory. The operation method of the present invention not only applies to GAAFET with more than one nanowire channels 40, but also any other memory components with nitride as a trapping layer for a transistor, namely a Silicon-Oxide-Nitride-Oxide-Silicon (SONOS) storing device. In an embodiment of the present invention, the multi-bits read only memory is the SONOS storing device. The SONOS storing device is a non-volatile memory (NVM) more closely relating to flash memory. The SONOS storing device however differs from main stream flash memories, as the SONOS storing device uses silicon nitride ($Si_3N_4$) as memory material instead of polycrystalline silicon. The operation method of the present invention applies to components with dimension of 5 nanometers (nm), and even applies to GAA and SONOS technologies under 5 nm. For this reason, the present invention demonstrates great application possibilities and great cutting-edge competitiveness.

In comparison with prior arts where current read only memories may only be programmed with a single bit of "0" or "1" using fusing or anti-fusing operations, the present invention presents a method to program multiple bits into a read only memory. By using the method disclosed in the present invention, the read only memory would be able to enhance data storing capabilities and to increase functionality. The data storing capabilities are enhanced by more densely storing multiple bits of information in the read only memory.

Even though numerous characteristics and advantages of the present invention have been set forth in the foregoing description, together with details of the structure and function of the invention, the disclosure is illustrative only. Any technical personnel in fields relating to the present invention is free to make equivalent changes of the present invention after reading information disclosed by the present invention. However, any equivalent changes made relating to the present invention will be protected by what is claimed for the present invention. Changes may be made in detail, especially in matters of shape, size, and arrangement of parts within the principles of the invention to the full extent indicated by the broad general meaning of the terms in which the appended claims are expressed.

In comparison with prior arts, the present invention is able to effectively overcome drawbacks of current techniques. The operation method of the multi-bits read only memory hereby may be applied to memories of consumer electronics, as well as memories of semiconductor industries, of integrated circuit industries, or within electronic components. As such, the present invention demonstrates great application possibilities and great cutting-edge competitiveness. The applicant of the present invention possesses trail proven experimental data to backup what is claimed for the present invention. Such experimental data also proves that technical details and outcomes of the present invention are drastically different from prior arts and also drastically different from what technical personnel of the related field would expect. The present invention should therefore be fully patentable.

What is claimed is:

1. An operation method of a multi-bits read only memory, wherein the multi-bits read only memory comprises a substrate and a transistor structure mounted on the substrate; the transistor structure comprises a conductive gate and two ion-doped areas respectively located on the two opposite sides of the conductive gate; the two ion-doped areas function as a first electrode and a second electrode located on opposite sides of the conductive gate in the transistor structure; a multiplicity of M nanowire channels are electrically connecting between the first electrode and the second electrode, and M is a positive integer greater than one; wherein the operation method comprises a step of providing a gate voltage to the conductive gate, a first voltage to the first electrode, and a second voltage to the second electrode while satisfying the following conditions:

condition (A): setting a fully opened state for the multi-bits read only memory by providing the gate voltage to the conductive gate, the first voltage to the first electrode, and the second voltage to the second electrode for conducting all nanowire channels; and condition (B): setting an $i^{th}$ state for the multi-bits read only memory by breaking i nanowire channels; wherein 1<i≤M; wherein the fully opened state, the first state to the $M^{th}$ state are representable as multiple programmable multi-bits.

2. The operation method of the multi-bits read only memory as claimed in claim 1, wherein when M=2, the fully opened state is represented as (1, 1) as the programmable multi-bits.

3. The operation method of the multi-bits read only memory as claimed in claim 1, wherein: when M=2, and all of the M nanowire channels are broken, the multi-bits read only memory is set to be the $M^{th}$ state, and the $M^{th}$ state is a second state; and the second state is represented as (0, 0) as the programmable multi-bits.

4. The operation method of the multi-bits read only memory as claimed in claim 1, wherein: when M=2, and one of the M nanowire channels is broken, the multi-bits read only memory is set to be in the first state, and the first state is represented as (1, 0) or (0, 1) as the programmable multi-bits.

5. The operation method of the multi-bits read only memory as claimed in claim 1, while satisfying condition (B), controlling the M nanowire channels with a controller, a controller chip, or a microcontroller unit (MCU); wherein the controller, the controller chip, or the microcontroller unit (MCU) controls whether each of the M nanowire channels is breaking, allowing the multi-bits read only memory to formulate $2^M$ types of programmed multi-bit variations.

6. The operation method of the multi-bits read only memory as claimed in claim 1, wherein the first electrode and the second electrode are respectively a drain and a source of the transistor structure.

7. The operation method of the multi-bits read only memory as claimed in claim 1, wherein an insulating oxide layer is mounted between the substrate and the transistor structure.

8. The operation method of the multi-bits read only memory as claimed in claim 1, wherein the multi-bits read only memory has (M+1) states.

9. The operation method of the multi-bits read only memory as claimed in claim 8, wherein each of the states consists of M bits, and each of the M bits corresponds to one of the M nanowire channels respectively.

10. The operation method of the multi-bits read only memory as claimed in claim 1, wherein the transistor structure is a Gate-All-Around FET (GAAFET).

11. The operation method of the multi-bits read only memory as claimed in claim 1, wherein the multi-bits read only memory is a Silicon-Oxide-Nitride-Oxide-Silicon (SONOS) storing device.

12. The operation method of the multi-bits read only memory as claimed in claim 1, while satisfying condition (B), providing a voltage, a current, a power, or an energy to the transistor structure; wherein the voltage, the current, the power, or the energy is provided to break i nanowire channels by fusing, and accordingly the $i^{th}$ state is formulated.

* * * * *